United States Patent [19]
Witte et al.

[11] Patent Number: 5,740,064
[45] Date of Patent: Apr. 14, 1998

[54] SAMPLING TECHNIQUE FOR WAVEFORM MEASURING INSTRUMENTS

[75] Inventors: Robert A. Witte, Monument; Matthew S. Holcomb, Colorado Springs, both of Colo.

[73] Assignee: Hewlett-Packard Co., Palo Alto, Calif.

[21] Appl. No.: 585,854

[22] Filed: Jan. 12, 1996

[51] Int. Cl.$^6$ ..................................................... G01R 13/20
[52] U.S. Cl. ..................... 364/487; 364/483; 324/121 R; 324/76.19; 324/76.24; 324/76.28; 324/76.38; 315/367; 345/134
[58] Field of Search ........................... 364/483–487, 364/572, 574, 701–702, 724.01, 724.04, 724.1, 724.14; 324/76.13, 76.15, 76.19, 76.24, 76.28–29, 76.38, 121 R; 341/61, 110, 122–123, 126, 132, 143, 155; 327/58, 91; 345/112, 133, 134; 348/254, 616–618, 631, 645, 665–670, 712–713; 358/519, 520; 315/367

[56] References Cited

U.S. PATENT DOCUMENTS

| | | | |
|---|---|---|---|
| 4,039,784 | 8/1977 | Quarton et al. | 395/140 |
| 4,183,087 | 1/1980 | Huelsman | 327/91 |
| 4,586,022 | 4/1986 | Acuff | 341/155 |
| 4,843,307 | 6/1989 | Ichijyo | 324/103 P |
| 5,115,189 | 5/1992 | Holcomb . | |
| 5,155,431 | 10/1992 | Holcomb | 324/121 R |
| 5,210,538 | 5/1993 | Kuroiwa | 341/160 |
| 5,233,546 | 8/1993 | Witte | 364/602 |
| 5,438,531 | 8/1995 | Shank | 364/724.1 |

*Primary Examiner*—James P. Trammell
*Assistant Examiner*—Tuan Q. Dam

[57] ABSTRACT

A new sampling technique for waveform measuring instruments (including methods and circuits for implementing same) comprises the step of processing a series of digital signal samples through a decimator to extract a decimated sample value from each decimated sample interval in a series of decimated sample intervals. The series of digital signal samples is simultaneously processed through a digital peak detector to extract maximum and minimum values (peak detect sample values) from each decimated sample interval. For a given decimated sample interval, a difference between the maximum and minimum sample values for the interval is calculated. If the difference exceeds a glitch detect threshold value, the maximum and minimum sample values for the given decimated sample interval are transferred to a video sample memory. If not, the decimated sample value for the given decimated sample interval is transferred to the video sample memory.

17 Claims, 8 Drawing Sheets

SAMPLING TECHNIQUE FOR WAVEFORM MEASURING INSTRUMENTS

BACKGROUND OF THE INVENTION

This invention pertains to waveform measuring instruments, and more particularly, the sampling technique used by a waveform measuring instrument (e.g., a digital oscilloscope or similar device) to acquire and graphically display the waveform of an input signal.

A waveform measuring instrument generally comprises three elements: an A/D converter, a memory, and a video display. Such an instrument acquires and displays an input signal's waveform by sampling the input signal, storing the acquired samples in memory, and then displaying the stored samples on its video display. Ideally, the instrument's A/D converter should always sample at its maximum sample rate, since a faster sampling rate is more likely to capture an accurate representation of the input signal's waveform. However, with present A/D converters sampling in the range of several Gigasamples/second, sampling a waveform at a low time base setting can require several Gigabytes of memory. This presents two problems. First, memories capable of storing several Gigabytes of data are costly. Second, video processors only operate at speeds of several Megabytes/second. Thus, displaying a waveform comprising several Gigabytes of information can cause a significant delay between consecutive sample set acquisitions by an A/D converter.

There have been many attempted solutions to the above problems. A first solution is to reduce the sampling rate of the A/D converter. However, such a solution introduces two additional problems - aliasing, and missing short duration excursions of a waveform such as narrow pulses and glitches. Aliasing is a phenomenon caused by violation of the Nyquist principle, which states that a true representation of a waveform cannot be acquired if an input signal is sampled at a frequency of less than twice its maximum frequency.

A second solution is to allow the A/D converter 100 to sample at its maximum rate, and then systematically reduce the number of samples that are stored to memory 104. One way to accomplish this task is to use a decimator 102 (FIG. 1). However, using a decimator 102 is similar to reducing the A/D converter's sample rate in that every Nth sample is stored to memory 104 and the rest are ignored.

One of the most effective prior solutions of systematically reducing the number of samples to be stored in memory 112 is to use a digital peak detector 110. For every N samples acquired by the A/D converter 108, a digital peak detector 110 stores a maximum and a minimum sample value (FIG. 2). Thus, if a short-duration event or glitch occurs during a sample interval, the event is captured (provided that the maximum A/D sample rate is fast enough to sample it). A digital peak detector 110 systematically retains essential data while maintaining the maximum sample rate of an A/D converter 108. However, a disadvantage to using a digital peak detector 110 is that it exaggerates and displays the worst case noise performance.

"Noise" consists of signals internal and external to the oscilloscope which are picked up by a sensitive A/D converter 100, 108 and appear 106, 114 superimposed on an input signal's waveform. For example, FIG. 8 shows an input signal's "true" waveform, and FIG. 9 shows the input signal's waveform with noise. Since a digital peak detector 110 looks for any peaks in a signal's waveform, regardless of whether they are caused by noise, "Peak Detect" mode is usually an optional feature of a waveform measuring instrument.

As a result of the foregoing disadvantages to existing sampling techniques, it is a primary object of this invention to provide a sampling technique for waveform measuring instruments in which the Peak Detect acquisition mode can be used at all times, without causing degradation of a waveform due to the exaggeration of noise.

It is also an object of this invention to provide a sampling technique which makes efficient use of sample memory.

It is a further object of this invention to provide circuits which may be used in implementing the new sampling technique.

It is yet another object of this invention to provide a sampling technique which allows for the use of anti-aliasing techniques such as that disclosed in U.S. Pat. No. 5,115,189 to Holcomb.

SUMMARY OF THE INVENTION

In the achievement of the foregoing objects, a new sampling technique for waveform measuring instruments is presented (including methods and circuits for implementing same).

The technique comprises the step of processing a series of digital signal samples through a decimator to extract a decimated sample value from each decimated sample interval in a series of decimated sample intervals. The series of digital signal samples is simultaneously processed through a digital peak detector to extract maximum and minimum values (peak detect sample values) from each decimated sample interval. For a given decimated sample interval, a difference between the maximum and minimum sample values for the interval is calculated. If the difference exceeds a glitch detect threshold value, the maximum and minimum sample values for the given decimated sample interval are transferred to a video sample memory. If not, the decimated sample value for the given decimated sample interval is transferred to the video sample memory.

The above sampling technique allows regular (or even continuous) use of a digital peak detector, without the worry of noise exaggeration.

The technique also allows for a more efficient use of memory. Peak detect sample values, which require twice the amount of storage space as a single decimated sample value, are stored less frequently.

These and other important advantages and objectives of the present invention will be further explained in, or will become apparent from, the accompanying description, drawings and claims.

BRIEF DESCRIPTION OF THE DRAWINGS

Illustrative and presently preferred embodiments of the invention are illustrated in the drawings in which.

DESCRIPTION OF THE PREFERRED EMBODIMENTS

Figure 1:
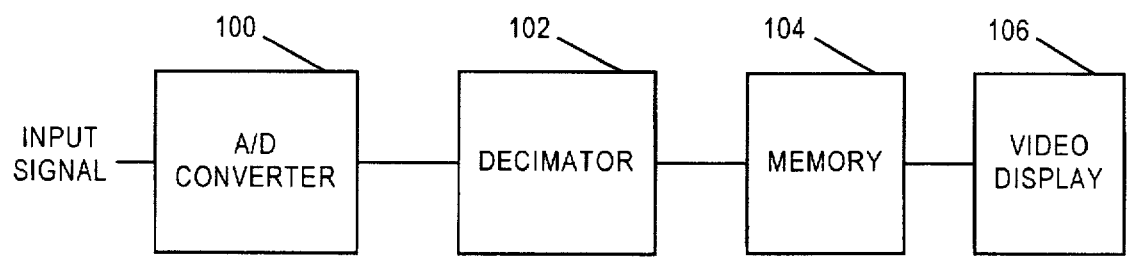
FIG. 1 is a block diagram of a circuit used for extracting decimated sample values from an input signal.

A new sampling technique for waveform measuring instruments is generally described below, and is diagramed in FIG. 3. The technique comprises the step of processing 116 a series of digital signal samples through a decimator 140 to extract a decimated sample value from each decimated sample interval in a series of decimated sample intervals. The series of decimated sample intervals comprises a sample set. Simultaneously with the above step, the series of digital signal samples is processed 118 through a digital peak detector 142 to extract maximum and minimum sample values (peak detect sample values) from each decimated sample interval. For each decimated sample interval, a difference between the maximum and minimum sample values for the interval is calculated 120. If the difference exceeds a glitch detect threshold value 122, 124, the maximum and minimum sample values for that interval are transferred 126 to a video sample memory 144 for future graphical display; if not, the decimated sample value for that interval is transferred 128 to the video sample memory 144.

Having thus described the sampling technique in general, the technique will now be described in further detail.

Before proceeding, it is important to note that a waveform measuring instrument may comprise several channels. Although the following description is made in conjunction with a single channel, the disclosed technique may readily be applied to a multiple channel instrument. In such a case, the technique would be applied in a similar manner to each channel of the instrument.

Figure 3:
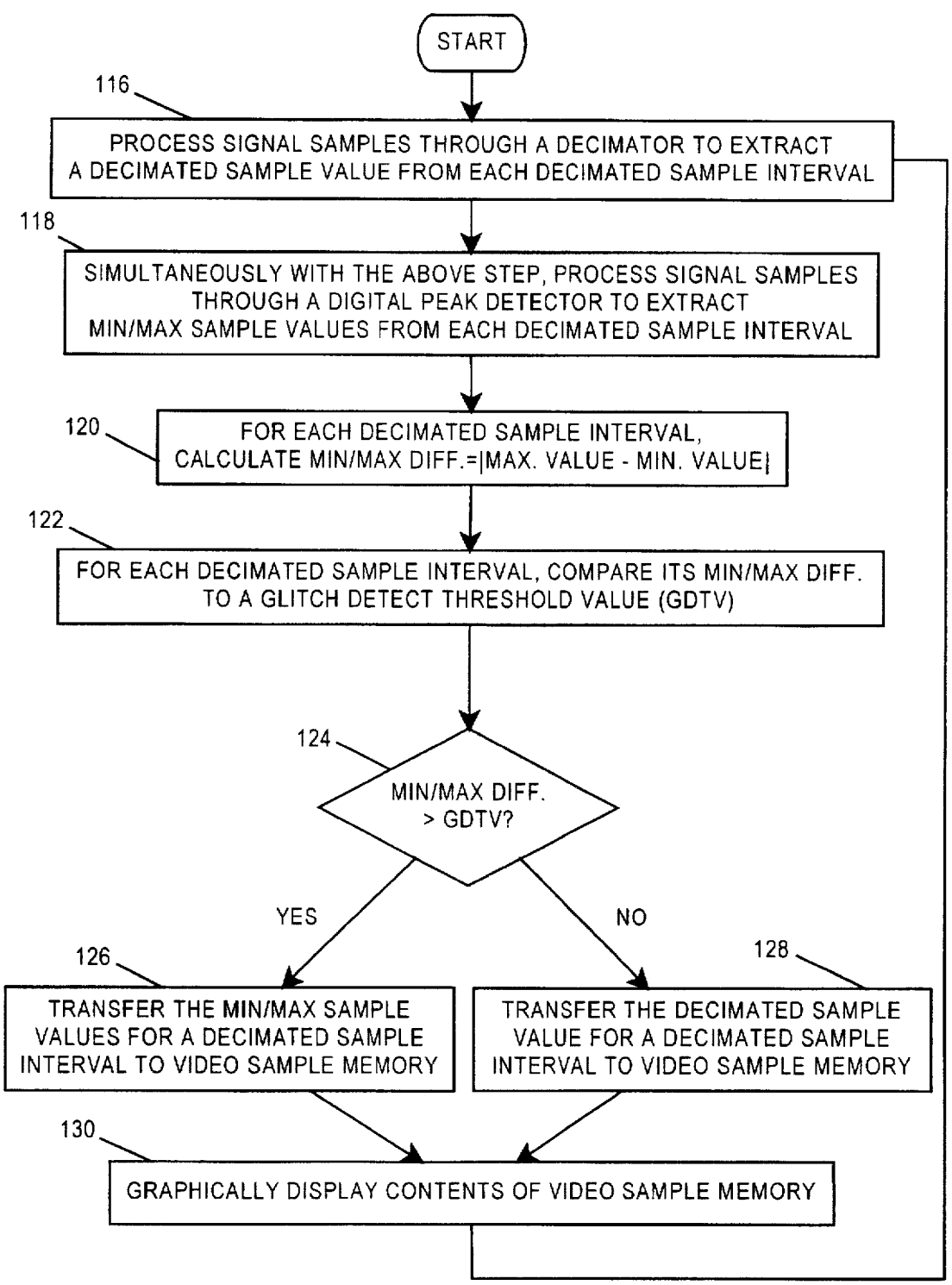
FIG. 3 is a flow chart of the various steps involved in the new sampling technique disclosed herein.
Figure 4:
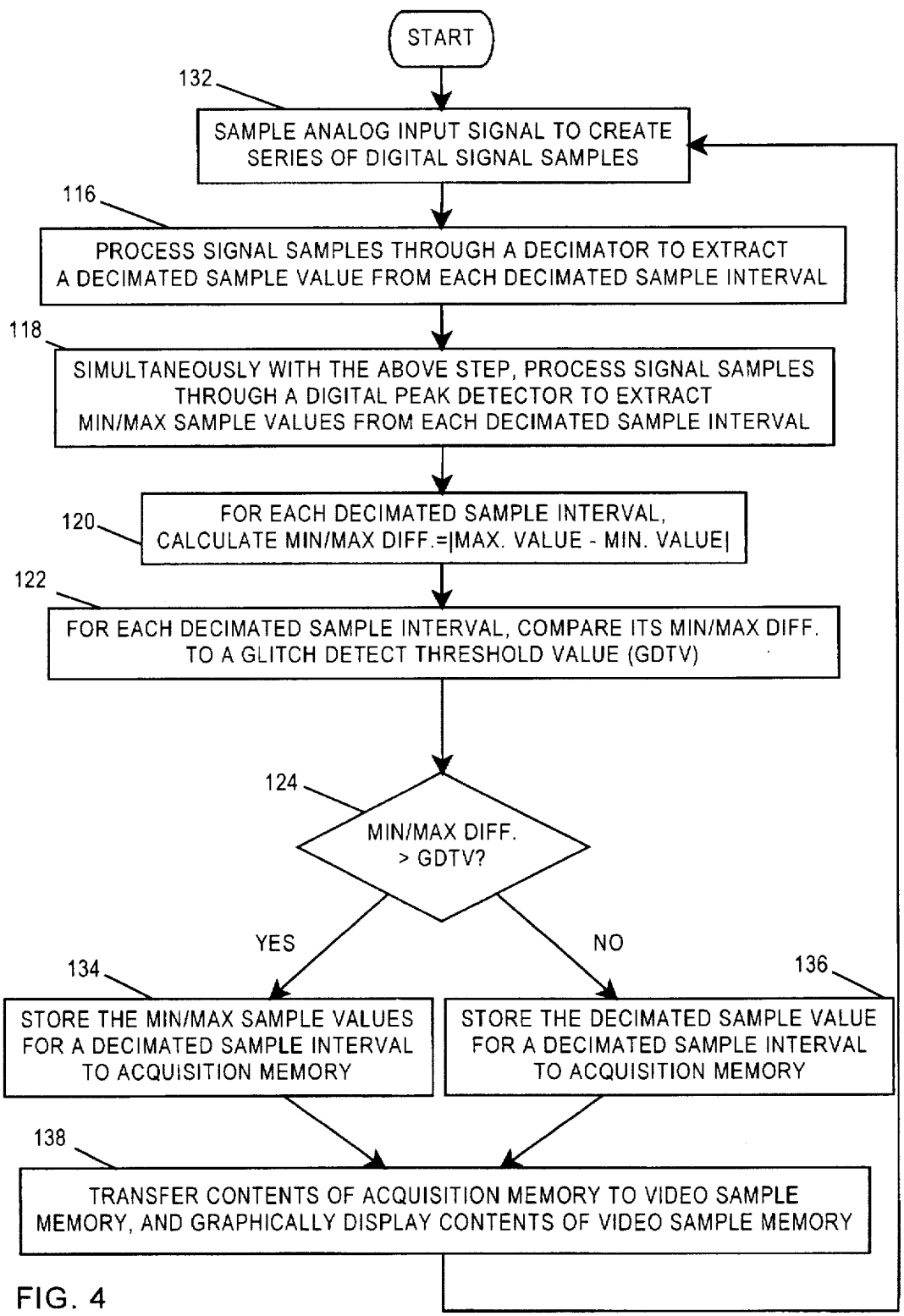
FIG. 4 is a flow chart of the various steps involved in a first preferred embodiment of the sampling technique disclosed herein.
Figure 5:
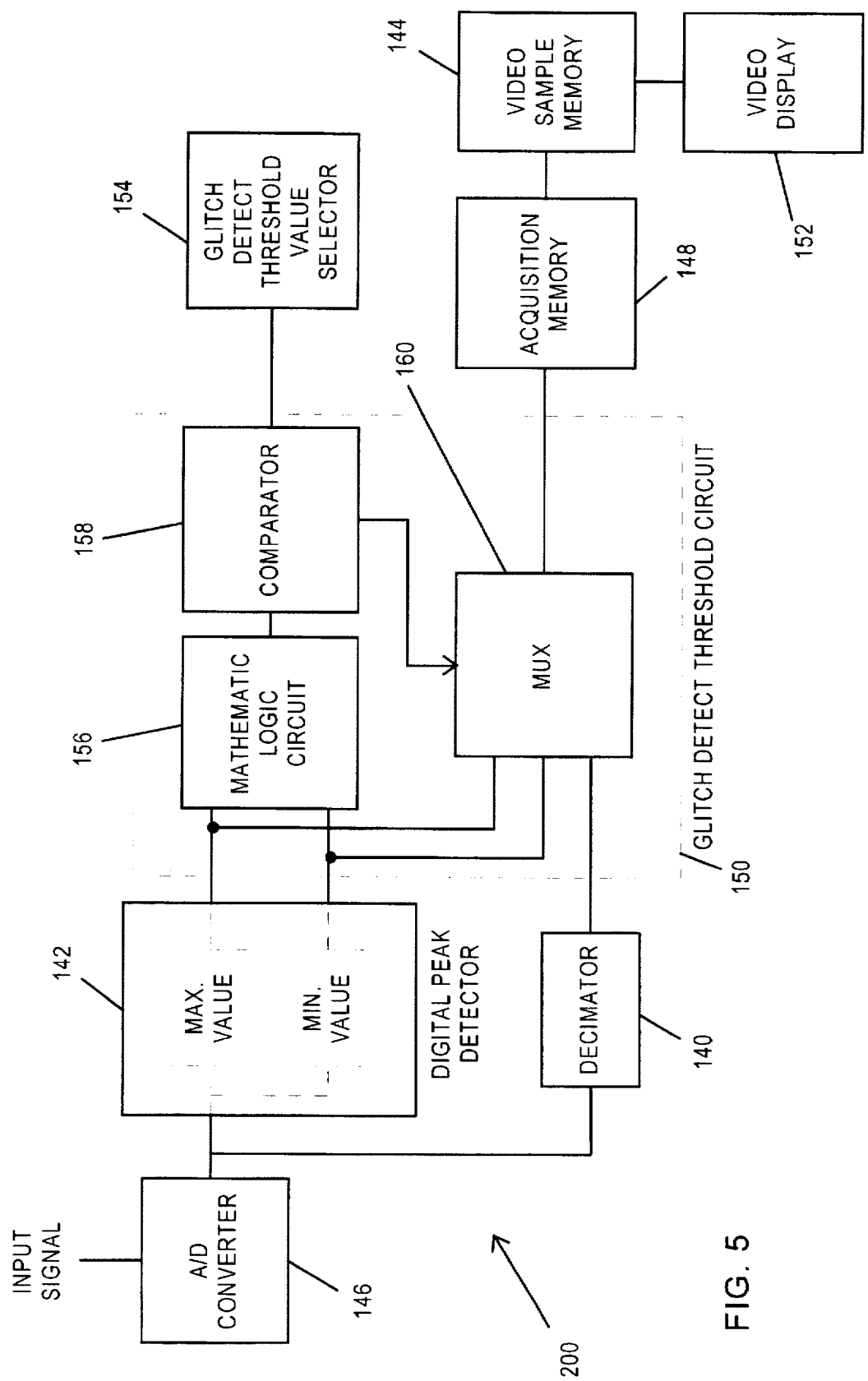
FIG. 5 is a block diagram of a circuit implementing the sampling technique of FIG. 4.

A first preferred embodiment of the FIG. 3 sampling technique is shown in FIG. 4. The technique begins as an analog-to-digital (A/D) converter 146 of a waveform measuring instrument samples an analog input signal and creates a series of digital signal samples 132 (hereinafter "samples"). Reference may be made to FIG. 5, which shows a circuit 200 of a waveform measuring instrument incorporating the technique presented in the flow chart of FIG. 4. The A/D converter 146 should preferably operate at its highest sampling rate so that the samples it acquires will completely and accurately represent an input signal's waveform.

Once acquired, the samples are simultaneously processed by a decimator 140 and a digital peak detector 142. The decimator 140 extracts every Nth sample (where N represents the number of samples in a decimated sample interval) and discards all other samples. The decimated sample interval is normally set using the "time base" control of a waveform measuring instrument (such controls are standard on oscilloscopes), but could be set explicitly in an instrument's firmware.

The digital peak detector 142 extracts minimum and maximum sample values ("min/max sample data" or "a min/max sample pair") from each decimated sample interval (the same interval of N samples referred to above).

In creating a graphical display, a glitch detect threshold circuit 150 causes either the min/max data or the decimated sample data for a given decimated sample interval to be transferred to a video sample memory 144. The contents of the video sample memory 144 may be displayed 138 on a video display 152.

The glitch detect threshold circuit 150 functions as follows. Min/max sample data is received from the outputs of the digital peak detector 142 so that a difference between the maximum and minimum sample values of each decimated sample interval may be calculated 120. Once calculated, the min/max differences are compared 122 to a specified glitch detect threshold value (GDTV). If the min/max difference of a given decimated sample interval exceeds the GDTV 124, the min/max sample data for that interval is stored 134 in a sample acquisition memory 148. If the min/max difference of a given decimated sample interval is less than the GDTV 124, the decimated sample data for that interval is stored 136 in the sample acquisition memory 148. After the samples of all decimated sample intervals comprising a sample set have been processed through the glitch detect threshold circuit 150, the sample acquisition memory 148 will comprise a combination of decimated and min/max sample data. To display the contents of the acquisition memory 148 to video, its contents are transferred to a video sample memory 144 and then displayed 138 on a video display 152.

The GDTV should be selected so that it is just large enough to eliminate min/max sample data which is a reflection of noise peaks. Thus, only min/max data which represents a significant deviation in a waveform, and which exceeds the defined GDTV, will be displayed. To achieve this result, the glitch detect threshold circuit 150 may be responsive to a GDTV selector 154. This selector 154 may comprise a manually adjustable knob, slide or the like located on an exterior of an instrument. Alternatively, the GDTV selector 154 can be implemented in the firmware of a waveform measuring instrument. If embodied in firmware, the GDTV selector may comprise either a constant or adjustable value. If adjustable, an adaptive filter within the firmware may monitor a waveform's characteristics, and automatically adjust (or set) the GDTV in response to changes in a waveform.

The glitch detect threshold circuit 150 may be fashioned in numerous ways, one of which is shown in FIG. 5. The circuit 150 comprises a mathematic logic circuit 156, a comparator 158 and a multiplexer (MUX) 160. The mathematic logic circuit 156 receives the minimum and maximum sample values from the outputs of the digital peak detector 142. For each decimated sample interval, it calculates 120 the difference between the maximum and minimum sample values of that interval. The results of its calculations are output as a series of min/max differences. The min/max differences are received by the comparator 158 and compared to the GDTV. As earlier stated, the GDTV may be provided by an external or internal selector 154. The comparator 154 outputs a signal which is indicative of whether the min/max difference of a decimated sample interval exceeds the GDTV. This signal is received as the multiplexer's 160 select input (SEL). If the select input indicates that a min/max difference exceeds the GDTV, the multiplexer data lines carrying minimum and maximum sample values are fed to the acquisition memory 148. If the select input indicates that a min/max difference does not exceed the GDTV, a multiplexer data line carrying a decimated sample value is connected to the acquisition memory 148. Operation of the decimator, digital peak detector, and glitch detect threshold circuit is synched via appropriate clock signals (not shown since their implementation is 'de minimis' to one skilled in the art).

The first preferred embodiment of the technique concludes as the contents of the acquisition memory 148 are transferred to a video sample memory 144 for display on a video display 152.

Figure 6:
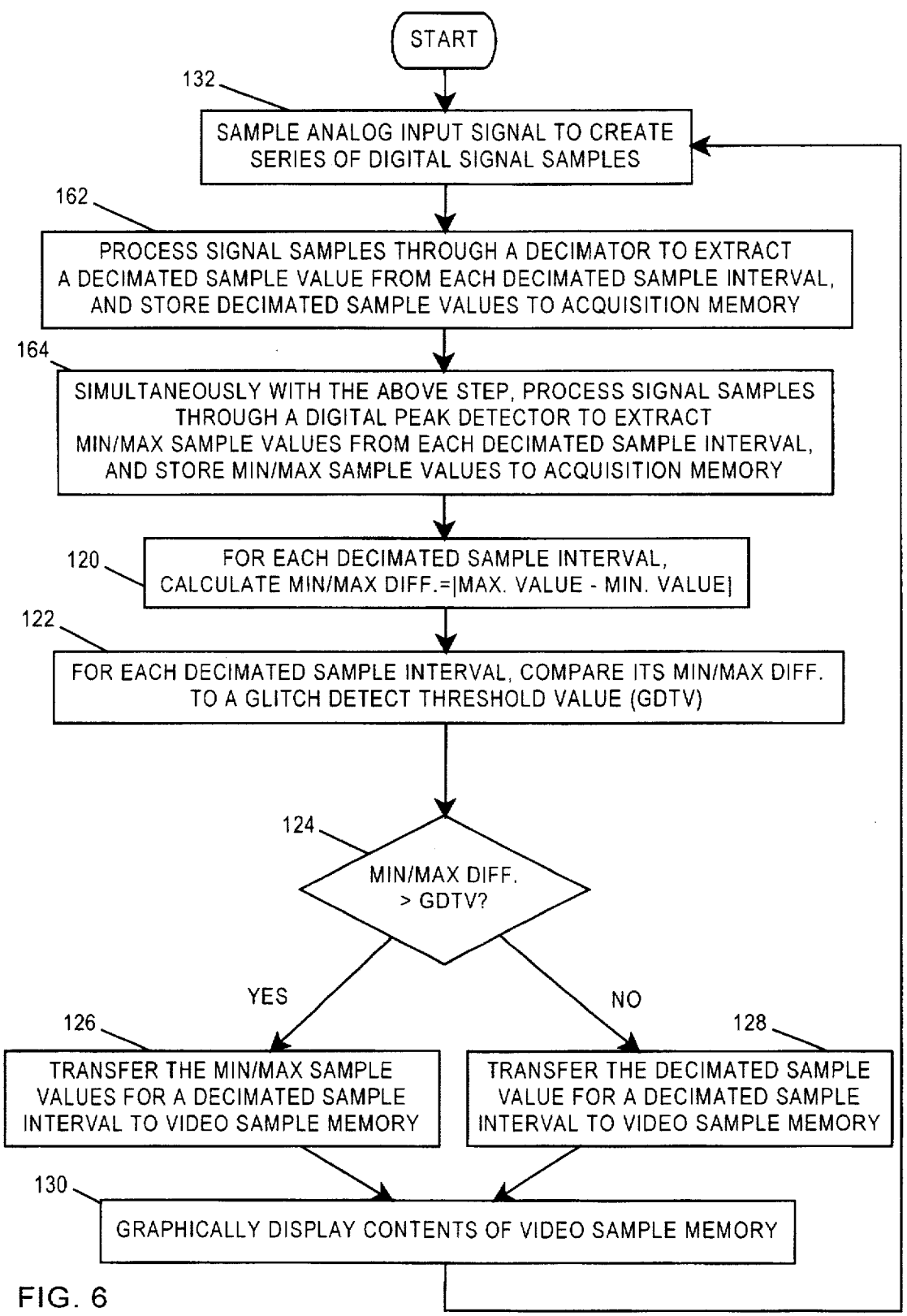
FIG. 6 is a flow chart of the various steps involved in a second preferred embodiment of the sampling technique disclosed herein.

In the first embodiment, data is first processed 120, 122, 124 through the glitch detect threshold circuit 150, and then stored 134, 136 to memory 148. This may be referred to as a "decide-then-store" approach. In a second embodiment of the sampling technique (FIGS. 6 & 7), data is first stored 162, 164 to memory 166, 168 and then later processed 120, 122, 124 through the glitch detect threshold circuit 150 (a "store-then-decide" approach). In the second embodiment 202, the single sample acquisition memory 148 which follows the glitch detect threshold circuit 150 in FIG. 5 is replaced with a pair of acquisition memories 166, 168 at the front end of the glitch detect threshold circuit 150. The reason for using a "store-then-decide" approach, thus requiring both a decimated sample values acquisition memory 168 and a peak detect sample values acquisition memory 166, is to accommodate A/D converters 146 which operate at very high clock speeds. When using a very high-speed A/D converter 146, signal samples may be acquired and stored much faster than the glitch detect threshold circuit 150 can process them. If the additional data processing which occurs in the glitch detect threshold circuit 150 were to be performed as a signal was being acquired, it would interfere with the fast, efficient acquisition of samples. By first storing the decimated and min/max sample data to memory 166, 168, data can be processed by the glitch detect threshold circuit 150 between sample set acquisitions, thus increasing a wave measuring instrument's overall efficiency. If desired, the decimated and peak detect sample value memories 166, 168 may merely comprise divisions of a single memory.

Note that a "store-then-decide" approach requires twice as much sample acquisition memory as a "decide-then-store" approach. Since memory is costly, instruments which do not incorporate high-speed A/D converters 146 can eliminate use of the additional memory, process data through the glitch detect threshold circuit 150 as it is acquired, and store a reduced size sample data set in a single sample acquisition memory 148. The content of the acquisition memory 148 may be transferred to a video sample memory 144 between the acquisition of consecutive sample sets.

Figure 8:
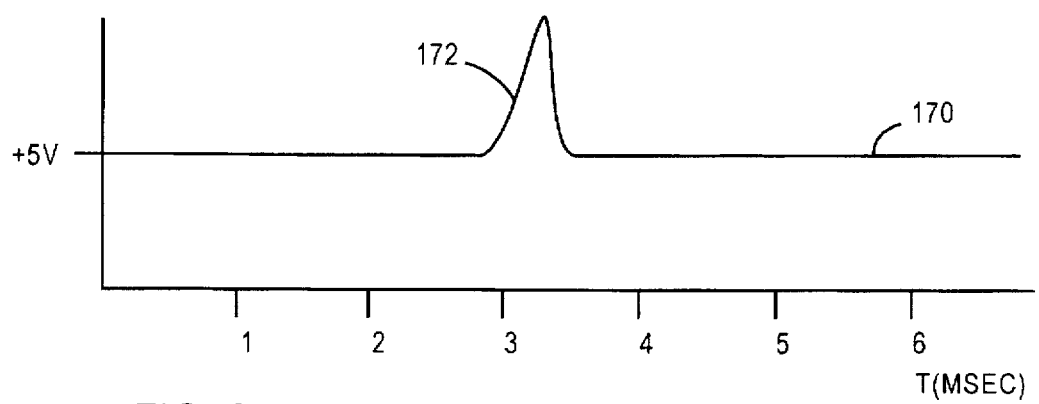
FIG. 8 displays the waveform of an input signal having a glitch.
Figure 9:
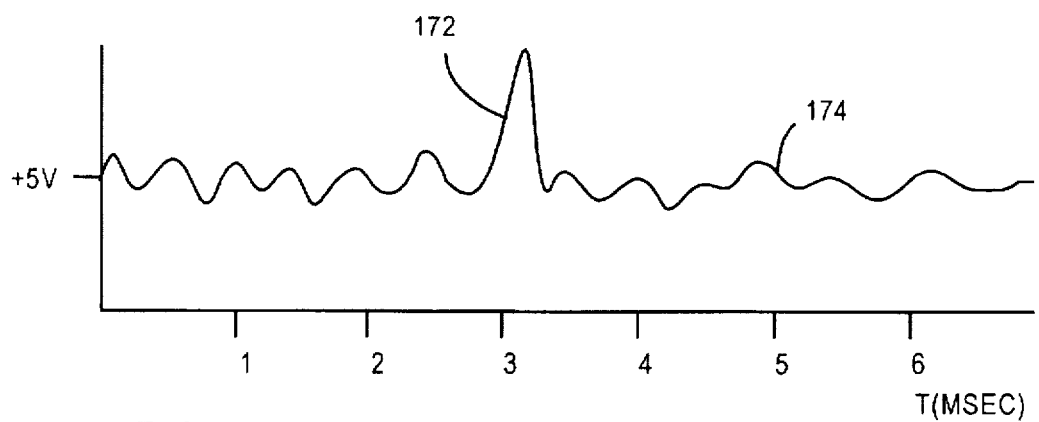
FIG. 9 displays the waveform of FIG. 8 with "noise"

The significance of the above described sampling technique can be appreciated with reference to FIGS. 8–13. FIG. 8 portrays the waveform 170 of a 5-volt DC input signal having a glitch 172. FIG. 9 portrays the same input signal with a "noise" component 174. An A/D converter 146 sampling the input signal 174 of FIG. 9 might produce the digital signal samples 176 plotted in FIG. 10.

Figure 10:
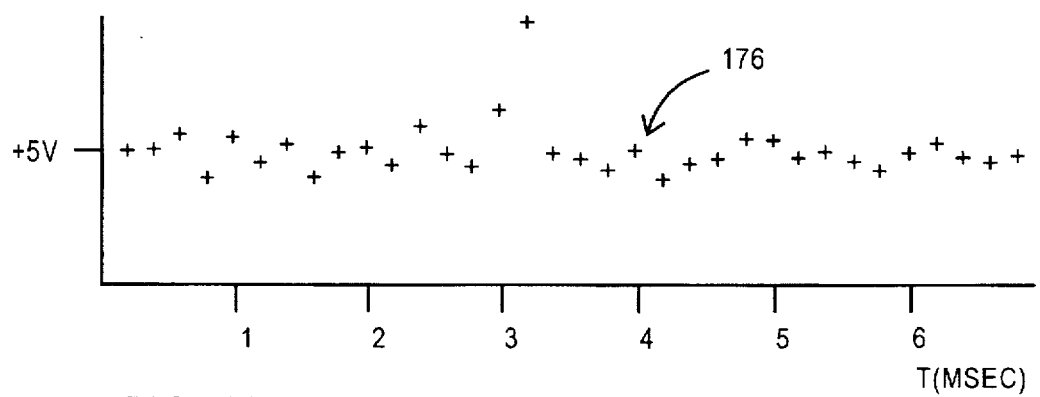
FIG. 10 displays the waveform of FIG. 9 as a series of digital signal samples.
Figure 11:
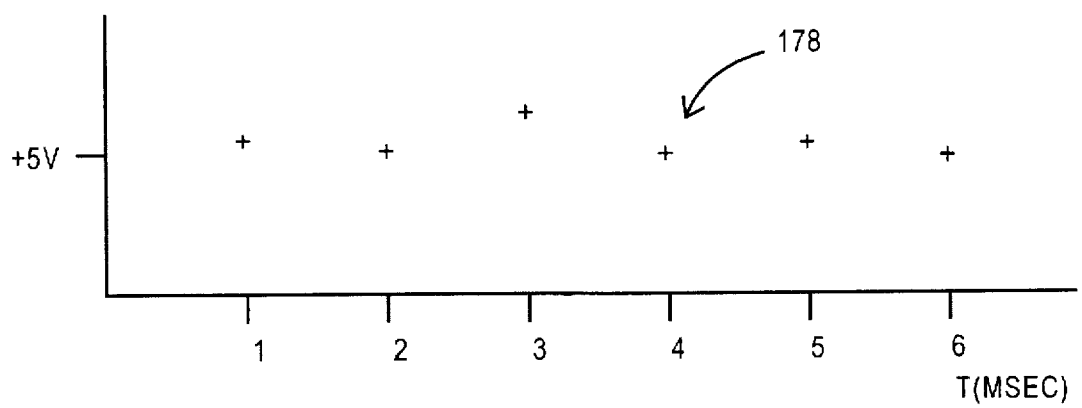
FIG. 11 displays the digital signal samples which are generated when the waveform of FIG. 9 is processed through the circuit of FIG. 1.

Since memory is expensive, and displaying too many samples can cause system delay, the samples 176 of FIG. 10 must be thinned out. Using a simple decimator as in FIG. 1, or as incorporated into FIGS. 5 & 7, the samples 178 plotted in FIG. 11 are acquired. If these samples 178 were to be displayed to video 152, the displayed waveform 178 would fail to capture the input signal's glitch 172.

Figure 2:
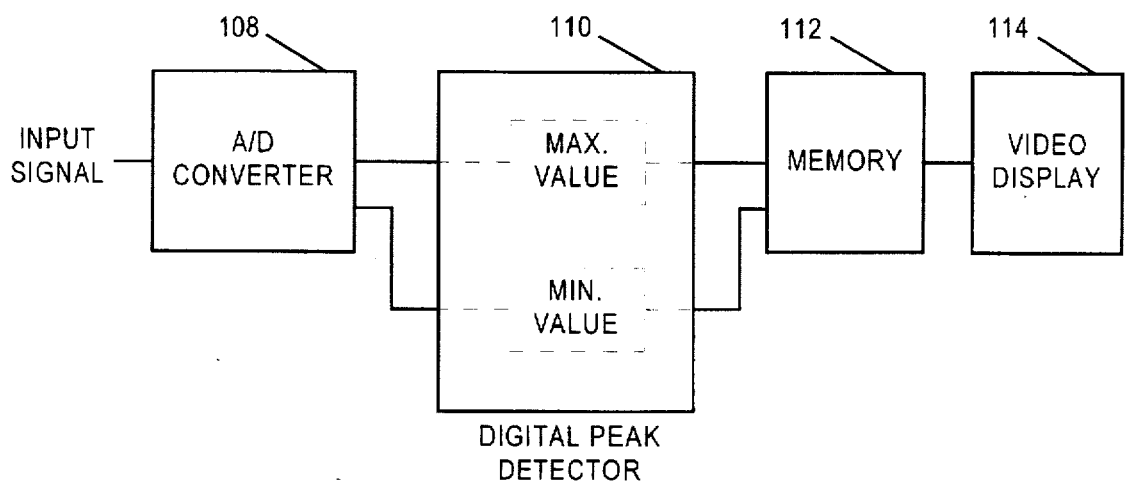
FIG. 2 is a block diagram of a circuit used for extracting peak detect sample values from an input signal.
Figure 7:
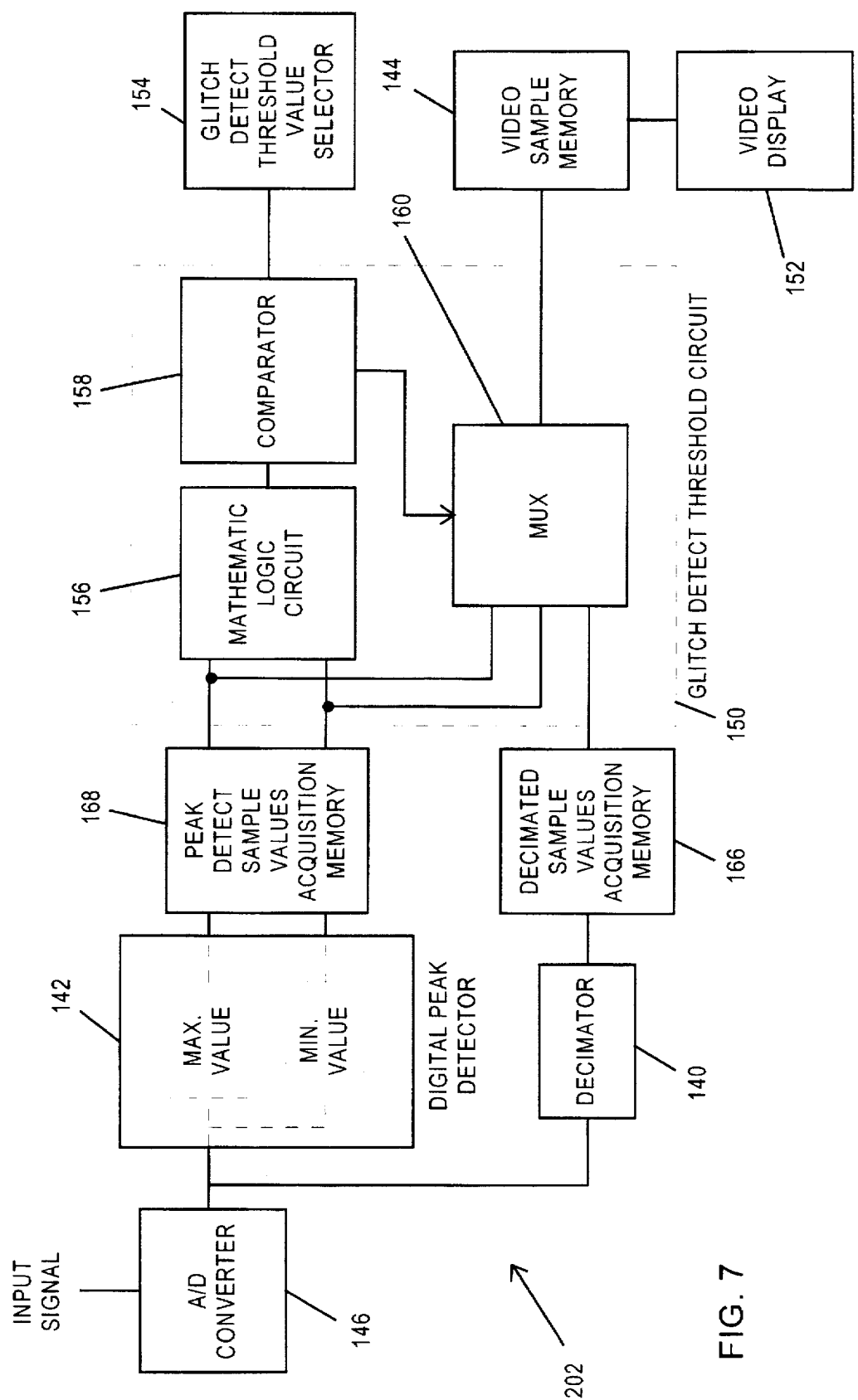
FIG. 7 is a block diagram of a circuit implementing the sampling technique of FIG. 6.
Figure 12:
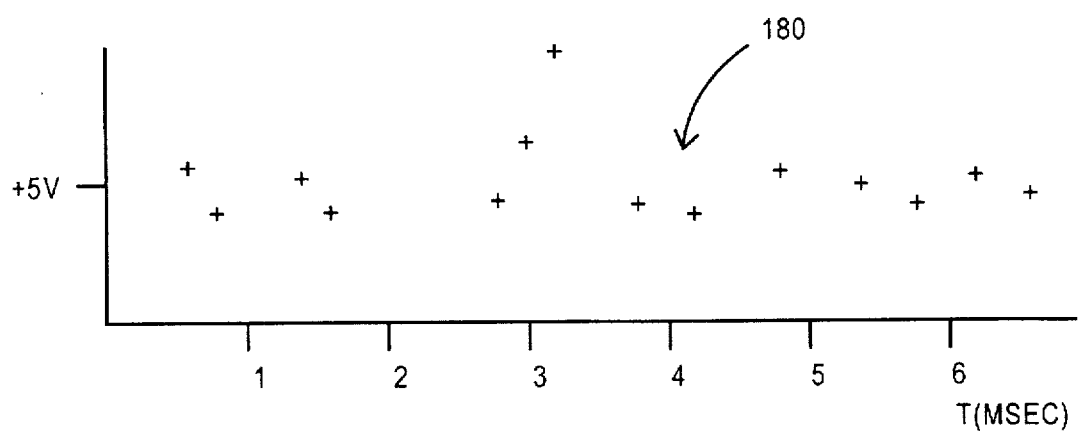
FIG. 12 displays the digital signal samples which are generated when the waveform of FIG. 9 is processed through the circuit of FIG. 2.

If the A/D converter's samples 176 are processed through a digital peak detector as in FIG. 2, or again, as incorporated into FIGS. 5 & 7, the samples 180 plotted in FIG. 12 are acquired. Note that this sample data set 180 catches the input signal's glitch 172. However, it also reflects a lot of the input signal's 174 noise component.

Figure 13:
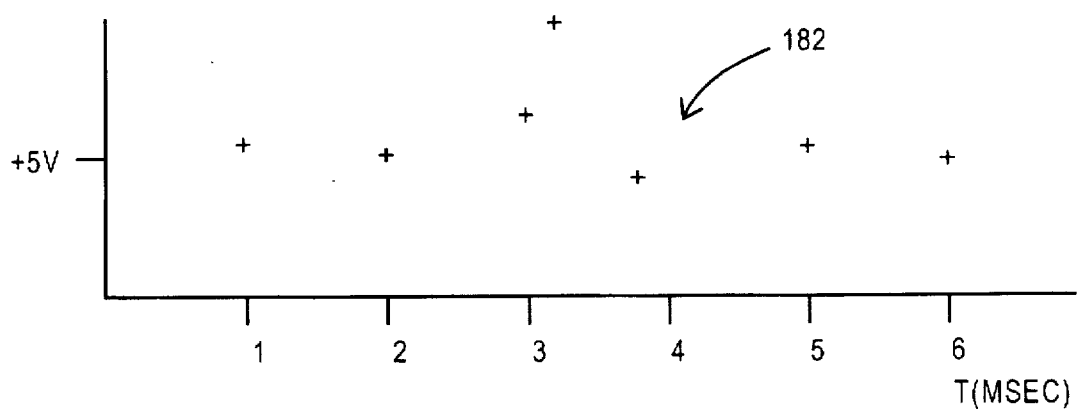
FIG. 13 displays the digital signal samples which are generated when the waveform of FIG. 9 is processed through the circuit of FIG. 5 or 7.

Using the disclosed sampling technique, and the circuit of FIG. 5 or 7, a plot of the samples 182 acquired for the input signal 174 of FIG. 9 would appear as in FIG. 13. The plotted samples 182 not only pick up the input signal's glitch 172, but they also eliminate much of the input signal's 174 noise component. Of all the waveforms pictured in FIGS. 9–13, the waveform of FIG. 13 is the most accurate depiction of the input signal's "true" waveform 170 (FIG. 8).

As mentioned in the Background of the Invention, supra, the primary problem with using an oscilloscope's Peak Detect mode is that it exaggerates signal noise by saving any samples which represent a deviation in a signal's waveform. In using the above described sampling technique, only those samples which represent a significant deviation in a signal's waveform will be saved to memory, thus resulting in a displayed waveform which more accurately depicts an input signal.

The term "decimator", as used herein, encompasses any device which extracts a single sample value from a decimated sample interval of N samples. The "decimator" disclosed in U.S. Pat. No. 5,115,189 to Holcomb is particularly useful when used in conjunction with the sampling technique disclosed herein. Holcomb discloses a concept now referred to as low frequency dither. A low frequency dither "decimator" randomly extracts 1-in-N samples (rather than every Nth sample) from a decimated sample interval. In doing so, it helps to prevent the effects of aliasing.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A sampling technique for a waveform measuring instrument, the technique comprising the steps of:

a) processing a series of digital signal samples through a decimator to extract a decimated sample value for each decimated sample interval in a series of decimated sample intervals;

b) processing the series of digital signal samples through a digital peak detector to extract a maximum sample value and a minimum sample value for each decimated sample interval in the series of decimated sample intervals; and c) for each decimated sample interval, and in response to a glitch detect threshold value, transferring either the maximum and minimum sample values or decimated sample value extracted from a decimated sample interval to a video sample memory.

2. A sampling technique as in claim 1, wherein transferring sample values to a video sample memory in response to a glitch detect threshold value comprises the steps of:

a) for each decimated sample interval, calculating a difference between its extracted maximum and minimum sample values; and b) for each decimated sample interval,
      i) if the difference between its extracted maximum and minimum sample values exceeds the glitch detect threshold value, transferring its maximum and minimum sample values to the video sample memory; and ii) if the difference between its extracted maximum and minimum sample values does not exceed the glitch detect threshold value, transferring its decimated sample value to the video sample memory.

3. A sampling technique as in claim 1, further comprising the step of manually selecting the glitch detect threshold value.

4. A sampling technique as in claim 1, further comprising the step of adjusting the glitch detect threshold value through a monitoring of at least one characteristic of the series of digital signal samples.

5. A sampling technique as in claim 1, further comprising the step of selecting the decimated sample interval.

6. A sampling technique as in claim 1, further comprising the steps of:
   a) sampling an analog input signal to create the series of digital signal samples; and
   b) graphically displaying the contents of the video sample memory.

7. A sampling technique as in claim 2, further comprising the steps of:
   a) storing the decimated sample values to a decimated sample values acquisition memory before performing the steps of claim 2; and
   b) storing the maximum and minimum sample values to a peak detect sample values acquisition memory before performing the steps of claim 2.

8. A sampling technique as in claim 7, wherein the decimated sample values acquisition memory and the peak detect sample values acquisition memory are divisions of a single memory.

9. A sampling technique as in claim 2, further comprising the steps of storing either the maximum and minimum sample values or decimated sample value extracted from a decimated sample interval to an acquisition memory, prior to transferring any values to the video sample memory.

10. A sampling circuit in a waveform measuring instrument, the circuit comprising:
    a) a digital peak detector producing min/max sample data for each decimated sample interval of a series of digital signal samples;
    b) a decimator producing decimated sample data for each decimated sample interval of the series of digital signal samples; and
    c) a glitch detect threshold circuit comprising,
       i) min/max sample data inputs;
       ii) a decimated sample data input; and
       iii) means to select whether the min/max sample data or the decimated sample data of a given decimated sample interval will be transferred to a video sample memory.

11. A circuit as in claim 10, wherein the glitch detect threshold circuit is responsive to a glitch detect threshold value selector.

12. A circuit as in claim 10, wherein the glitch detect threshold circuit comprises:
    a) a mathematic logic circuit having min/max sample data inputs, and producing a min/max difference for each decimated sample interval of a series of digital signal samples;
    b) a comparator, responsive to a glitch detect threshold value, having a min/max difference input, and an output which is indicative of whether its min/max difference input exceeds the glitch detect threshold value; and
    c) a multiplexer having min/max and decimated sample data inputs, a select input connected to the comparator's output, and an output line which is configured to transfer either min/max or decimated sample data to the video sample memory in response to the glitch detect threshold value.

13. A waveform measuring instrument, comprising:
    a) an A/D converter comprising an analog signal input and a digital signal sample output;
    b) a video sample memory;
    c) a digital peak detector comprising an input derived from the A/D converter's digital signal sample output, a maximum sample value output, and a minimum sample value output;
    d) a decimator comprising an input derived from the A/D converter's digital signal sample output, and a decimated sample value output;
    e) a glitch detect threshold circuit, responsive to a glitch detect threshold value, for selectively transferring data derived from either the digital peak detector outputs or the decimator output to the video sample memory; and
    f) a video display, connected to the video sample memory.

14. An instrument as in claim 13, further comprising a glitch detect threshold value selector.

15. An instrument as in claim 14, wherein the automatic glitch detect threshold value selector comprises an adaptive filter.

16. An instrument as in claim 13, further comprising:
    a) a peak detect sample values acquisition memory comprising inputs connected to the minimum and maximum sample value outputs of the digital peak detector, a maximum sample value output, and a minimum sample value output; and
    b) a decimated sample values acquisition memory comprising an input connected to the decimated sample value output of the decimator, and a decimated sample value output.

17. A digital oscilloscope as in claim 13, wherein the glitch detect threshold circuit comprises:
    a) a mathematic logic circuit comprising inputs derived from the digital peak detector's outputs, and a min/max difference output;
    b) a comparator, responsive to the glitch detect threshold value, comprising an input connected to the mathematic logic circuit's min/max difference output, and an output indicative of whether the min/max difference input exceeds the glitch detect threshold value; and
    c) a multiplexer comprising,
       i) a plurality of input data lines, respectively connected to the outputs of the digital peak detector and the decimator;
       ii) a select input connected to the output of the comparator; and
       iii) an output line which is configured to transfer either min/max or decimated sample data to the video sample memory in response to the select input.

* * * * *